United States Patent [19]
Burnham et al.

[11] Patent Number: 4,727,557
[45] Date of Patent: Feb. 23, 1988

[54] PHASED ARRAY SEMICONDUCTOR LASERS FABRICATED FROM IMPURITY INDUCED DISORDERING

[75] Inventors: Robert D. Burnham, Palo Alto; Robert L. Thornton, East Palo Alto, both of Calif.

[73] Assignee: Xerox Corporation, Stamford, Conn.

[21] Appl. No.: 814,863

[22] Filed: Dec. 30, 1985

[51] Int. Cl.$^4$ .............................................. H01S 3/19
[52] U.S. Cl. ...................................... 372/50; 357/17; 357/4; 372/45; 372/46
[58] Field of Search ................. 372/44, 45, 46, 50, 372/18, 29; 357/17, 4 SL

[56] References Cited

U.S. PATENT DOCUMENTS

| Re. 31,806 | 1/1985 | Scifres et al. | 372/50 |
| 4,378,255 | 3/1983 | Holonyak et al. | 148/1.5 |
| 4,503,540 | 3/1985 | Nakashima et al. | 372/50 |

OTHER PUBLICATIONS

S. Mukai et al., "Fundamental Mode Oscillation . . . Laser Array", Apl., vol. 45(8), pp. 834–835 (Oct. 15, 1984).
W. Streifer et al., "Phased Array Diode Lasers", Laser Focus/Electro-Optics, Jun. 1984.
J. Katz et al., "Supermode Discrimination in Phased-Locked Arrays of Semiconductor Lasers", IEEE International Semiconductor Conference in Brazil, Jul. 1984.
Twu et al., "High Power Coupled Ridge Waveguide Semiconductor Laser Arrays", Apl., vol. 45(7), pp. 709–711 (Oct. 1, 1984).

Primary Examiner—James W. Davie
Assistant Examiner—Georgia Y. Epps
Attorney, Agent, or Firm—W. Douglas Carothers, Jr.

[57] ABSTRACT

Phased array semiconductor lasers provide fundamental or preferred 1st supermode operation wherein fabrication is accomplished by a single, continuous fabricating process, e.g. MO-CVD or MBE, followed by impurity induced disordering (IID), e.g. utilization of the impurity diffusion technique or the implant/anneal technique as now known in the art. The laser comprising this invention is provided with a relatively thin active region or with a single or multiple quantum well structure in the active region and is fabricated by forming spatially disposed impurity induced disordering regions extending into or penetrating through the active region to form spatially disposed regions capable of providing higher gain compared to adjacent regions not experiencing impurity induced disordering. The adjacent regions without impurity induced disordering contain unspoiled regions that provide high real index waveguiding compared to the adjacent disordered regions with the diffusions in the disordered regions have higher conductivity properties compared to the remaining ordered regions and are, therefore, more efficiently pumped electrically. As a result, disordered regions form alternating higher gain regions offset between regions of nondisordered waveguide regions having higher real index waveguiding properties but lower gain properties, thereby fulfilling the conditions necessary to provide fundamental or preferred 1st supermode operation.

12 Claims, 5 Drawing Figures

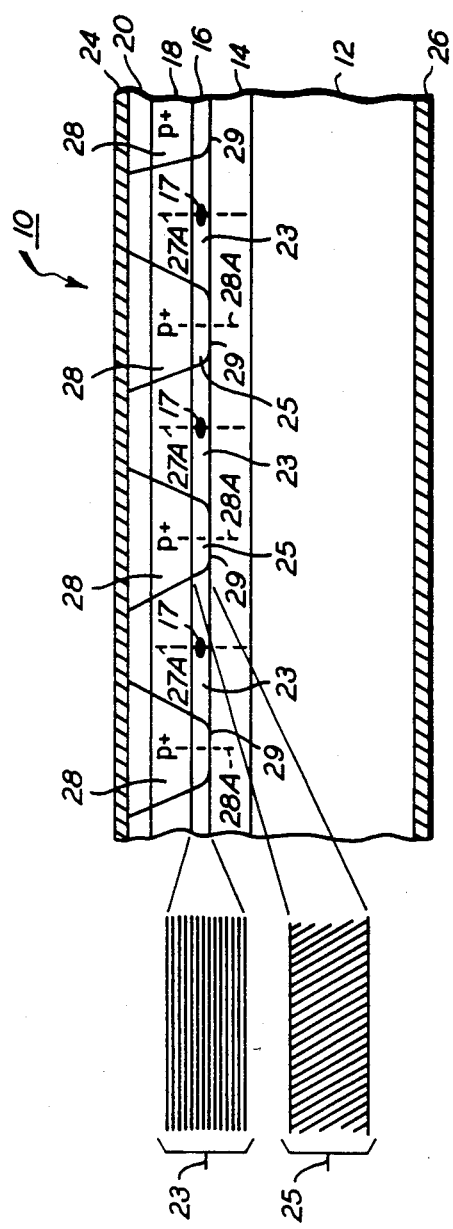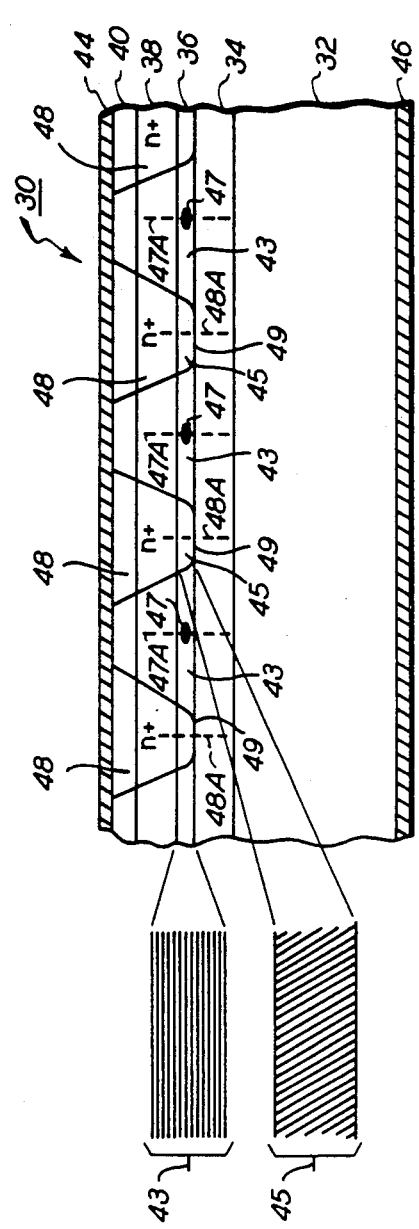
FIG. 1
FIG. 2

PHASED ARRAY SEMICONDUCTOR LASERS FABRICATED FROM IMPURITY INDUCED DISORDERING

CROSS-REFERENCE TO RELATED APPLICATIONS

This application contains subject matter related to the subject matter of patent application Ser. No. 736,040 filed May 20, 1985 and patent application Ser. No. 814,825, filed Dec. 30, 1985 both assigned to the same assignee herein.

BACKGROUND OF THE INVENTION

This invention relates to semiconductor array lasers and in particular to phase locked array lasers having preferred fundamental supermode operation with a structural design that utilizes impurity induced disordering (IID).

Phased array semiconductor lasers comprise a plurality of closely coupled or spaced emitters on the same integral structure or substrate. Examples of such phased array lasers are illustrated in U.S. Pat. No. 4,255,717, now U.S. Pat. No. Re. 31,806, and in an article of William Streifer et al., entitled "Phased Array Diode Lasers", published in the June 1984 Issue of *Laser Focus/Electro-Optics*. The emitters of such a laser are represented by the periodically spaced current confinement means, e.g. stripes, for current pumping and establishment of spaced optical cavities in the active region of the structure. The current confinement means may be interconnected or closely spaced to a degree that the optical mode established in each of the lasing cavities below a respective current confinement means couples to its neighboring optical modes, i.e., the evanescent wave overlaps into adjacent optical lasing cavities. The array of optical fields produced become locked in phase, and, if the phase difference between adjacent current confinement means is zero, the lateral radiation pattern in the far field will comprise a single lobe. However, as explained in the above mentioned article, the phased array laser does not operate in a single mode but rather generally operate with two or more lobes in the far field pattern. The phase relationship between adjacent optical modes is not under independent control and the phases will adjust themselves in a manner toward minimizing laser threshold current. In most cases, it appears that the lasing mode favored is a supermode wherein the optical field between adjacent optical emitters passes through zero. This is because in most real refractive index lasers as well as many gain guided lasers, current pumping is spread out between the laser emitters reducing the overall required level of current pumping.

The foregoing explanation can be exemplified as follows. An array laser with N coupled emitters has N possible coupled modes, which are referred to as "supermodes". A supermode is a cooperative lasing of the N optical emitters or filaments of the array laser. Since there are N emitters, there are N possible supermodes since all these emitters are optically coupled together.

Each supermode has the property that the $1^{st}$ and the $N^{th}$ supermode have the same intensity pattern or envelope, the $2^{nd}$ and the $(N-1)^{th}$ have the same intensity envelope, and, in general, the $i^{th}$ and $[N-(i-1)]^{th}$ have the same intensity envelopes. The $1^{st}$ or fundamental supermode has all emitters lasing in phase with an amplitude distribution representative of half a sinusoidal cycle. This is the only supermode pattern that radiates in a single central lobe in the far field pattern because all emitters are in phase.

Thus, for a uniformly spaced array of identical emitters, the $1^{st}$ and $N^{th}$ supermode envelopes are half a sinusoidal period, the second and the $(N-1)^{th}$ supermode envelopes are two half sinusoidal periods, etc. The phase relationship between the individual emitters in N supermodes differ. Specifically, for the $1^{st}$ supermode, all emitters are in phase and for the $N^{th}$ supermode, the phases alternate between zero and n. Usually the $1^{st}$ and $N^{th}$ supermodes have the lowest current thresholds as compared to all other supermodes because their intensity envelopes do not exhibit nulls near the center of the array where the charge density is greater as a result of current spreading and charge diffusion in the active region of the array laser. However, as previously indicated, the $N^{th}$ supermode, which radiates in two lobes, has a lower current threshold of operation than the $1^{st}$ supermode.

Phased array lasers have high utility due to their high power output and lower beam divergence. It is preferred that the power be concentrated in a single lobe, i.e., in the $1^{st}$ supermode. The reason is that a substantial majority of laser applications require power in a single far field lobe. If lasing is experienced in more than one lobe, measures are taken to diminish or otherwise attempt to eliminate or block off the other operating lobes in the far field pattern.

Recently, there has been much activity relative to phase locked array lasers or phased array lasers where efforts have been established to discriminate among the supermodes and provide fundamental supermode selection. One such suggestion was at the IEEE 9th Conference in Brazil, July, 1984 wherein J. Katz et al presented a talk on supermode discrimination by controlling lateral gain distribution along the plane of the lasing elements by incorporating a separate contact to each laser array element and tailoring the currents through the array laser elements. The abstract for the talk is found in the Proceedings of the Conference at pages 94 and 95 entitled "Supermode Discrimination in Phase-Locked Arrays of Semiconductor Laser Arrays".

More recently is the articles of Twu et al entitled "High Power Coupled Ridge Waveguide Semiconductor Laser Arrays", *Applied Physics Letters*, Vol. 45(7), pp. 709–711 (Oct. 1, 1984) and of S. Mukai et al entitled "Fundamental Mode Oscillation of Buried Ridge Waveguide Laser Array", *Applied Physics Letters*, Vol. 45(8), pp. 834–835 (Oct. 15, 1984). These articles suggest discrimination among the supermodes to obtain the single lobe fundamental supermode by employing index guided ridge waveguide structure wherein the laser elements are uniformly pumped with the optical field mainly confined to the ridge region of the structure while higher gain is experienced in the valley or coupling regions to induce inphase operation (0° phase) and promotion of fundamental supermode operation.

Further techniques to discriminate among supermodes are illustrated in U.S. patent application Ser. No. 667,251 filed Nov. 1, 1984 U.S. Pat. No. 4,624,000 entitled "Phased Array Semiconductor Lasers with Preferred Emission in a Single Lobe" and assigned to the same assignee herein. The techniques proposed in this application relate to the use of structural means associated with the laser to enhance the amount of gain experienced in regions between adjacent optical cavities of lasing elements by spatially modulating the optical overlap of the optical field of each of the laser elements across the array to thereby favor the fundamental supermode over other potential modes.

Recently, advances have been made in the art to better delineate the bandgap and refractive indices properties in a single semiconductor device by disordering quantum well structures epitaxially deposited as part of a semiconductor device. An example of the foregoing is U.S. Pat. No. 4,378,255 to Holonyak wherein there is taught the technique of selectively disordering a multiple qunatum structure or multiple quantum well in a semiconductor device through the employment of a zinc diffusion thereby causing an upward shifting of the bandgap of the well regions of the quantum structure compared to regions of the multiple quantum well structure where disordering has not occurred. Such diffusions can be generally carried out in a temperature range of 500° C. to 600° C., which is lower than the epigrowth temperature which is about 750° C. Such disordering is also possible with other elements such as Si, Ge, Sn and S but at higher temperatures, e.g., about 675° C. and above. Further, disordering is possible through implantation of elements acting as shallow or deep level impurities, such as, Se, Mg, Sn, O, S, Be, Te, Si, Mn, Zn, Cd, Sn or Cr followed by a high temperature anneal at temperatures optimum to each particular impurity, e.g. 500° C.–900° C. depending upon the particular type of impurity and best performed in an As environment. It also has even been shown possible to disorder by implantation of III–V elements, such as Al. It has also been further shown possible to use a wide variety of elements to bring about disordering through implantation and annealing. For example, the inert element, Kr, has been shown to induce disordering. In the case of impurity implant followed by an anneal, the anneal temperatures are relatively at higher temperatures compared to diffusion temperatures, e.g., above 800° C.

The present invention represents an improved phased array semiconductor laser providing the desired fundamental supermode operation but utilizing Impurity Induced Disordering (IID) techniques thereby avoiding any subsequent etching and/or regrowth processes utilized in prior art phased array semiconductor lasers.

SUMMARY OF THE INVENTION

According to this invention, phased array semiconductor lasers provide fundamental or preferred $1^{st}$ supermode operation wherein fabrication is accomplished by a single, continuous fabricating process, e.g. MO-CVD or MBE, followed by impurity induced disordering (IID), e.g. utilization of the impurity diffusion technique or the implant/anneal technique, both known in the art. The laser comprising this invention is provided with a relatively thin active region or with a single or multiple quantum well structure in the active region which is fabricated by forming spatially disposed impurity induced disordering regions extending into or penetrating through the active region to form spatially disposed regions capable of providing higher gain compared to adjacent regions not experiencing impurity induced disordering. The adjacent regions without impurity induced disordering contain unspoiled regions that provide higher real index waveguiding compared to the adjacent disordered regions. The disordered regions provide a higher bandgap p-n junction compared to the p-n junction at the remaining nondisordered or unspoiled active regions and, therefore, the higher bandgap junctions in the disordered regions conduct significantly less current at a given junction voltage than the active region junctions of each laser element. As a result, the leakage current through the disordered region junctions represent only a small fraction of the total current through the array laser device and does not significantly degrade device performance.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 schematically illustrates a side elevation of a first embodiment of the array semiconductor laser of this invention.

FIG. 2 schematically illustrates a side elevation of a second embodiment of the array semiconductor laser of this invention.

DETAILED DESCRIPTION OF THE PREFERRED EMBODIMENTS

Figure 3:
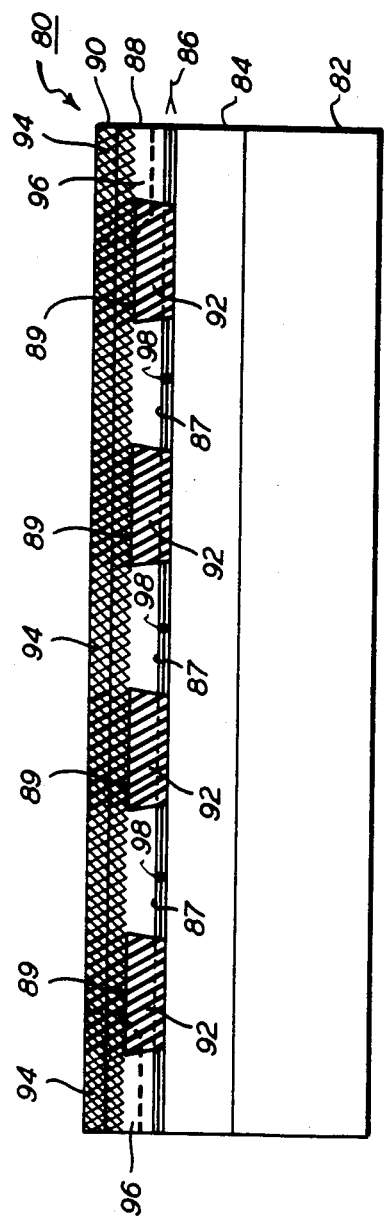
FIG. 3 schematically illustrates a side elevation of a third embodiment of the array semiconductor laser of this invention.

Reference is now made to FIG. 1 wherein there is illustrated a first embodiment of the phased array semiconductor laser of this invention. Phase locked array laser 10 is illustrated in the III—V material regime of GaAs/GaAlAs. Laser 10 comprises a substrate 12 of n-GaAs upon which is epitaxially deposited a cladding layer 14 of n-Ga$_{1-x}$Al$_x$As; an active region 16 being undoped, or p-type doped or n-type doped and can comprise a relatively thin conventional double heterostructure (DH) active layer or a single quantum well of either GaAs or Ga$_{1-y}$Al$_y$As where y is very small and x>y or a multiple quantum well structure of alternating well layers of GaAs or Ga$_{1-y}$Al$_y$As and corresponding barrier layers of either AlAs or Ga$_{1-y'}$Al$_{y'}$As, where x,y'>y or a separate single or multiple quantum well structure in a separate confinement cavity; a cladding layer 18 of p-Ga$_{1-z}$Al$_z$As where x,z,y'>y; and cap layer 20 of p+ GaAs. There may be a thin n-GaAs buffer layer deposited on substrate 12 prior to deposition of layers 14–20. The epitaxial deposition may be MOCVD, which is known in the art.

It is preferred in the practice of this invention that the multiple emitters of laser 10, represented by the facet emission points 17, be sufficiently close to one another to operate in a phase locked condition. However, this is not essential to the practice of producing IID regions that the emitters be phase locked or not, as there may be instances where phasing locking may not be required or necessary.

As an example of typical layer thicknesses, cladding layer 14 may be in the range of 0.5 to 1.0 μm and active region 16 may be a thin conventional active layer having a thickness range, for example, of 50 nm–300 nm quantum well structure wherein the quantum wells of GaAs may be about 3 nm–50 nm thick and the barrier layers of $Ga_{1-y'}Al_{y'}As$ may be about 1 nm–15 nm thick with y' in the range of 0.1 to 1.0. Cladding layer 18 may have a thickness in the range of 0.1 to 1.0 μm. Cap layer 20 may be in the range of 0.1 to 1.0 μm.

As a specific example, active region 16 may comprise two well layers consisting of a pair of p-GaAs well layers, each 7 nm thick, separated by a 4 nm thick barrier layer consisting of undoped $Ga_{0.65}Al_{0.35}As$. The exterior surfaces of the well layers may each be contiguous with a transparent waveguide layer of $Ga_{0.65}Al_{0.35}As$ which are, in turn, contiguous with cladding layers 14 and 18, which respectively may be a 1.5 μm thick n-$Ga_{0.15}Al_{0.85}As$ layer and a 1.0 μm p-$Ga_{0.15}Al_{0.85}As$ layer.

To form a multi-emitter array laser, impurity induced disordering (IID) techniques known in the art may be utilized, e.g diffusion disordering or implant/anneal disordering. It should be noted here that these types of disordering are not limited to species traditionally considered as impurities but also can be extended to include any species that either disorders the crystal through diffusion or damages the crystal, through implantation with subsequent high temperature annealing of the damaged crystal creating the desired disordered crystal.

In discussing the present invention, reference will be made to the use of diffusion disordering, although implant/anneal disordering may also be utilized. To form a multi-emitter array laser, a $Si_3N_4$ mask is formed on the top surface of cap layer 20 with openings exposing regions of the laser structure to impurity diffusion. The masks protect regions forming a series of laser optical cavities or elements having facet emission points 17 and that are sufficiently close to one another so as to provide optically coupled adjacent emitters, i.e., the evanescent wave of a neighboring optical cavity overlaps into adjacent optical cavities.

The current confinement means and desired refractive index profile are established by selectively diffusing a high concentration p impurity into the exposed regions of the laser structure. For example, zinc may be selectively diffused at 700° C. for a sufficient period of time in a semi-sealed graphite boat containing appropriate diffusion sources. This type of process would be typically carried out in a hydrogen flow. The diffusion of zinc into the quantum well active region 16 causes an intermixing of Al and Ga in the GaAs-GaAlAs in the active region resulting in a GaAlAs alloy of averaged AlAs mole fraction illustrated as IID regions 28 in FIG. 1. In the case of a thin active layer of GaAs, or single quantum well layer of GaAs or $Ga_{1-y}Al_yAs$, the intermixing is between Ga in the active layer and Al in the adjacent cladding layer 18 of $Ga_{1-z}Al_zAs$. In the case of a multiple quantum well structure, the intermixing of Al and Ga is principally between the well and barrier layers. The diffusion of zinc is accomplished at a relatively low temperature, such as, 700° C. and is maintained for a sufficiently long period of time, e.g. several hours, to penetrate active region 16, as indicated at points 29.

Upon completion of the diffusion step, conventional metal contacts 24 and 26 are applied respectively to the surface of cap layer 20 and bottom surface of substrate 12.

The array of zinc diffused regions 28 serve the dual function of smearing out or disordering the quantum well structure in active region 16 to provide an index profile for guiding the propagation of radiation along the optical cavity of each laser element, represented by dotted lines 27A. Due to the lower index profile provided by IID regions 28, the structure encourages operation of the array of lasers with a single lobe far field pattern. The resulting laser structure in the plane of active region 16 is such that a plurality of higher index guiding regions 23 are provided in the nondisordered areas of active region 16. These regions 23 provide for enhanced waveguiding due to a higher refractive index compared to adjacent disordered regions 25 of active region 16. Further, IID p+ regions 28 provide a p-n junction 29 at the boundary of high aluminum cladding layer 14, which junction has a higher turn-on voltage compared to p-n junction in the vicinity of active regions 23. Since the bandgap of the material at junctions 29 is significantly higher than at the active region junctions, junctions 29 conduct significantly less current at a given junction voltage than the lasing junctions. Therefore, the leakage curent through the high aluminum junction 29 is only a very small fraction of the total current through the array device and does not significantly degrade device performance.

In FIG. 2, array laser 30 is of identical structure to array laser 10, except that the impurity type of the respective semiconductor layers comprising the laser structure are reversed. Laser 30 comprises a substrate 32 of p-GaAs upon which is epitaxially deposited a cladding layer 34 of p-$Ga_{1-x}Al_xAs$; an active region 36 being undoped or p-type or n-type and can comprise any active region structure commonly known in the art as previously exemplified in FIG. 1 relative to region 16; a cladding layer 38 of n-$Ga_{1-z}Al_zAs$ where x, z>y; and a cap layer 40 of n+GaAs.

The example of layer thicknesses for the structural layers of laser 30 may be in the ranges exemplified for the corresponding layers of laser 10.

To form a multi-emitter array laser, a $Si_3N_4$ mask is formed on thetop regions of layer 40 with openings exposing regions of the laser structure to IID techniques as previously explained. A series of laser elements with emission points 47 are formed that are sufficiently close to one another so as to provide optically coupled adjacent emitters, i.e., the evanescent wave of a neighboring optical cavity overlaps into adjacent optical cavities. The establishment of the current confinement means and refractive index profile are established in the manner previously explained, except an n-type diffusant, e.g., silicon, tin or germanium, is utilized to effectively disorder the multiple quantum well structures in regions 38 to a depth penetrating active region 36 thereby forming optical guide regions 47A.

Upon completion of the diffusion step, conventional metal contacts 44 and 46 are applied respectively to the surface of cap layer 40 and bottom surface of substrate 32.

The array of silicon diffused regions 48 serve the dual function of smearing out or disordering the quantum well structure in active region 36 to provide an index profile for guiding the propagation of radiation along the optical cavity of each laser element, represented by dotted line 47A. Due to the lower index profile provided by IID regions 48, the structure encourages operation of the array of lasers with a single lobe far field pattern. The resulting laser structure in the plane of active region 36 is such that a plurality of higher index guiding regions 43 are provided in the nondisordered areas of active region 36. These regions 43 provide for enhanced waveguiding due to a higher refractive index compared to adjacent disordered regions 45 of active region 36. Further, IID n+ regions 48 provide a p-n junction 49 at the boundary of high aluminum cladding layer 34, which junction has a higher turn-on voltage compared to p-n junction in the vicinity of active regions 43. Since the bandgap of the material at junctions 49 is significantly higher than at the active region junctions, junctions 49 conduct significantly less current at a given junction voltage than the lasing junctions. Therefore, the leakage current through the high aluminum junction 49 is only a very small fraction of the total current through the array device and does not significantly degrade device performance.

In connection with the embodiments of both FIGS. 1 and 2, it will be evident to those skilled in the art that in the illustration for laser 10 in FIG. 1, the p+ type diffused regions 28 may be n+ type diffused regions, e.g silicon, so long as the background doping of active region 16 is p-type. By the same token, for laser 30 in FIG. 2, the n+ type diffused regions 48 may be p+ type diffused regions, e.g zinc, so long as the background doping of active region 36 is n type.

In FIG. 3, array laser 80 comprises n-GaAs substrate 82 upon which are epitaxially deposited the following layers: cladding layer 84 of n-$Ga_{1-x}Al_xAs$ where x may, for example, be equal to 0.4 and the layer may be about 1.5 $\mu$m thick; active region 86 comprising a thin conventional DH active layer or a single quantum well structure or a multiple quantum well structure, for example, GaAs four quantum well layers each 10 nm thick separated by barrier $Ga_{0.65}Al_{0.35}As$ layers each 4 nm thick; cladding layer 88 of p-$Ga_{1-x}Al_xAs$ where x may, for example, be equal to 0.4 and the layer may be about 0.8 $\mu$m thick; and cap layer 90 of p+-GaAs being about 0.1 $\mu$m thick. The active region may be p doped, n doped or undoped.

In order to form the IID n-type regions 92 shown in FIG. 3 as well as the embodiments shown in FIG. 1 and 2, an array of diffusion windows are patterned into a $Si_3N_4$ film deposited on cap layer 90, followed by the deposition of a silicon film to serve as the source of silicon for the diffusion process. The processing of array laser 80 begins with the deposition of a film of $Si_3N_4$ of about 100 nm thick. This film is photolithographically patterned to provide windows or openings for forming regions 92 via Si diffusion. Next, an approximately 50 nm thick film of silicon is deposited on the array, followed by another film of $Si_3N_4$ of approximately 100 nm thickness. Diffusion is performed at 850° C. for 7.5 hours to disorder the active region in areas adjacent to what will eventually become the lasing filaments as represented by emitters 98.

The n-type Si diffusion regions are shown as crosshatched regions 92 extending through active region 86. It is preferred that the diffusion extend through the active layer. The result to be realized is that the diffusion must extend sufficiently through the active region of each laser element to provide lower index regions between adjacent emitters due to the disordered active region thereby forming an index guided array of laser elements. The diffusion regions 92 provide both optical confinement of this wave as well as carrier confinement to the individual laser cavities, represented by the emitters 98, due to the establishment of a higher voltage p-n junction 89 in the disordered regions compared to the p-n junction 87 established in the waveguide region, represented by emitters 98.

After the diffusion, the Si layer and both $Si_3N_4$ layers are removed by etching in a $CF_4$ plasma. The entire surface of array 80 is then Zn-diffused, as indicated by the crosshatched area 94, to reconvert the n-type Si-diffused GaAs cap layer 90 and part of cladding layer 88 to p-type material. It is important that the Zn diffusion penetrate into cladding layer 88, because of the properties of the resulting parasitic p-n junction 89 that is in parallel with the active region lasing junction 87. As a result of the Zn diffusion, this parasitic junction 89 lies in a high aluminum cladding layer 88, which junction has a much higher turn-on voltage than that of junction 87 active region 86. Since the bandgap of the material at junction 89 is significantly higher than at the active region junction 87, junction 89 conducts significantly less current at a given junction voltage than the lasing junction 87. Therefore, the leakage current through the high aluminum junction 89 is only a very small fraction of the total current through the array device and does not significantly degrade device performance.

Finally, a relatively broad mask is aligned to cover a little more than midway of the outer two diffusion regions 92 of the device and a proton bombardment isolation is performed on the outlying regions of the array laser 80. This isolation is represented by the dotted lines in FIG. 3 forming isolation regions 96. The purpose of this implant is to prevent current flow in the outlying regions 96 that have not been previously disordered by the silicon diffusion. To accomplish this, the implant need only fall somewhere within the outer Si disordered regions and the alignment of the implant mask is not, therefore, critical.

After proton implantation at an energy of 70 keV with a dose of $3 \times 10^{15}$, laser array 80 is metallized with Cr-Au or Ti-Pt-Au on cap layer 90 and alloyed with Au-Ge, followed by Cr-Au or Ti-Pt-Au on the bottom surface of substrate 82.

Figure 4:
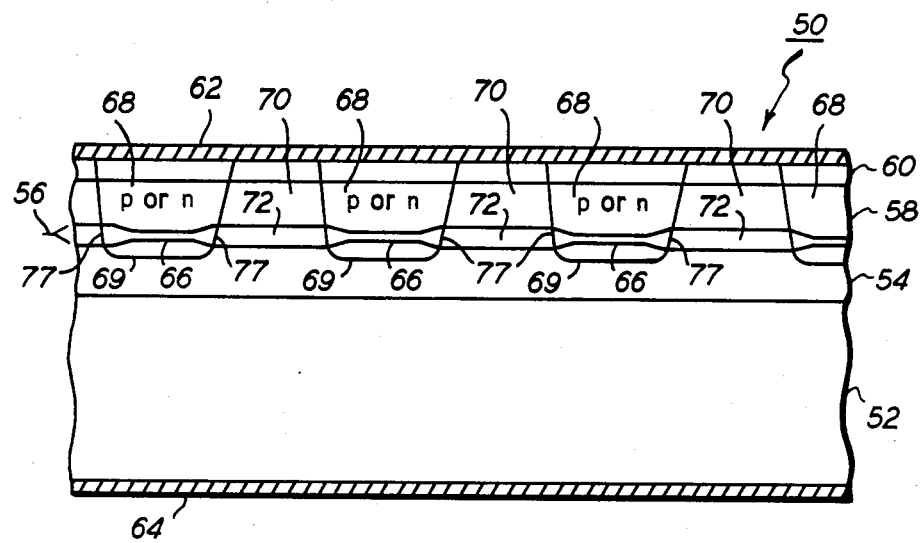
FIG. 4 schematically illustrates a side elevation of a third embodiment of the array semiconductor laser of this invention.

In FIG. 4, array laser 50 illustrates IID regions fabricated in a laser structure having a conventional double heterostructure active region comprising a thin active layer 56 that is not sufficiently thin to experience quantum size effects. Laser 50 comprises a substrate 52 of n-GaAs upon which are epitaxially deposited cladding layer 54 of n-$Ga_{1-x}Al_xAs$; a thin active layer 56 of undoped, or p-type doped, or n-type doped GaAs having a thickness, for example, in the range of 50 nm to 300 nm; a cladding layer 58 of p-GaAlAs and a cap layer 60 of p+GaAs. Upon completion of IID treatment, conventional metal contacts 62 and 64 are applied respectively to the surface of cap layer 60 and bottom surface of substrate 52.

To form a multi-emitter array laser, IID regions 68 are formed in the manner previously explained relative to lasers 10 and 30. Regions 68 may extend to the depth of active layer 56 or extend through this layer into cladding layer 54. Due to the larger thickness of the active layer 56, IID treated active regions 66 in active layer 56 are not fully disordered but rather are partially disordered as illustrated by the thinner extent of active layer 56 in regions 68. The partial compositional disordering in regions 68 of active layer 56 provide alternate thinner active areas laterally across the laser structure so that a modulated index profile in the active region is established laterally across the laser structure. This modulated index difference, depending upon, inter alia, the thicknesses of active layer 56, will provide for lasing preference either in the thicker regions 70 of active layer 56, represented by emitters 72 or in the thinner regions 66 of active layer 56, represented by p-n junctions 77.

Figure 5:
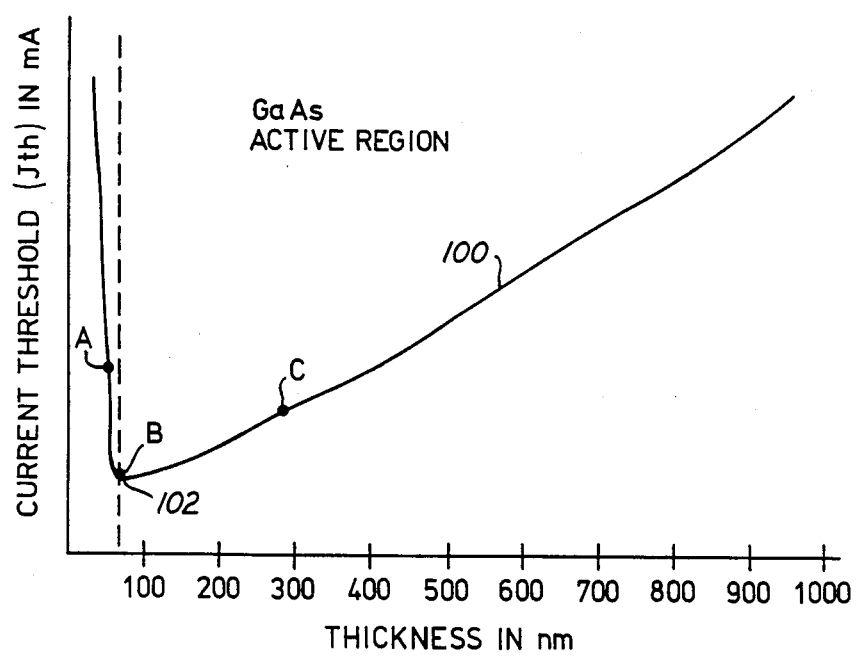
FIG. 5 is a graphic illustration of the effect of the current density at threshold, and, therefore, index waveguiding properties at the optical cavity of the individual laser elements of the array, this effect based upon different active region thicknesses for the array laser of FIG. 4.

According to the doping concentration of layers 54–58 of array laser 50 and the layer thicknesses, particularly the active layer 56, the array laser can be designed to lase efficiently in either the IID regions 68 or the non IID regions 70. FIG. 5 represents the criteria for active layer thickness for lasing in the areas of non IID regions 70 based upon changes in active layer thickness in IID regions 68 of active layer 56 compared to non IID regions 70 of active layer 56 due to disordering. As shown by the curve 100 in FIG. 5, the current density at threshold varies significantly depending on the thickness of active region 56. The minima 102 of curve 100 is at approximately 60 nm thickness, representing the point of lowest threshold current density for voltage turn-on of a junction disposed at the active layer. For example, if point A of curve 100 represents the thickness of active layer 56 at disordered active regions 66 and point B represents the thickness of active layer 56 at active regions 70, lasing will occur at active regions 72 since the lasing current density threshold is less at these regions compared to disoedered active regions 66. In this case, the p-n junction would be in the vicinity of active regions 72. By the same token, if point B of curve 100 represents the thickness of disordered active regions 66 at IID regions 68 and point C represents the thickness of active regions 72 at non IID regions 70, lasing will occur at regions 66 since the current density threshold is less at these regions compared to regions 70. In this case the p-n junction for carrier recombination would be at point 77 where region 68 crosses active layer 56, and carriers injected at this junction would diffuse into the disordered lasing region 66. Of course, the foregoing situations depend upon conductivety type of the layers as exemplified in the comparative description of FIGS. 1 and 2, as is also known in the art.

Although the geometries illustrated in FIGS. 1–4 are planar structures, it will be evident to those skilled in the art that the impurity induced disordering regions provided in those structures may also be utilized in nonplanar laser geometries as well, such as, for example, channel or mesa substrate lasers having multiple lasing elements.

Although all the foregoing embodiments have been described in connection with semiconductors of the GaAs and GaAlAs regime, other light emitting materials may be employed, such as InGaAsP, GaAlAsP, InGaAlP, InGaAlAsP, GaAlSb and appropriate II-VI materials, such as, ZnSe/ZnSSe. Further, as indicated in each embodiment illustrated, the active region may comprise a single active layer or, alternatively, may comprise an active region of either single quantum well or multiquantum well.

While the invention has been described in conjunction with a few specific embodiments, it is evident to those skilled in the art that manu alternatives, modifications and variations will be apparent in light of the foregoing description. Accordingly, the invention is intended to embrace all such alternatives, modifications and variations as fall within the spirit and scope of the appended claims.

What is claimed is:

1. In a phased array semiconductor laser having a plurality of semiconductor layers with a series of multiple lasing elements disposed in spatially separated optical cavities therein, said layers including an active region for light wave generation and propagation under lasing conditions and wherein the optical field of said lasing elements are coupled to provide a phase locked condition across the array, an impurity induced into regions laterally adjacent to and between said spatially separated optical cavities and penetrating through said active region therein causing a partial or full interdiffusion of elemental constituents of said therein active region with elemental constituents of at least one adjacent semiconductor layer to produce disordered alloy regions having a higher gain than the gain experience in said optical cavities and having an average lower refractive index profile therein compared to the original refractive index profile present in said optical cavities thereby creative of an index waveguide for said optical cavities.

2. The phased array semiconductor laser of claim 1 wherein said induced impurity comprises an impurity diffusion.

3. The phased array semiconductor laser of claim 1 wherein said induced impurity comprises an implant/anneal technique.

4. The phased array semiconductor laser of claim 1 wherein said active region comprises a single quantum well.

5. The phased array semiconductor laser of claim 4 wherein said active region is planar.

6. The phased array semiconductor laser of claim 4 wherein said active region is nonplanar.

7. The phased array semiconductor laser of claim 1 wherein said active region comprises a multiple quantum well consisting of alternating wells and barriers.

8. The phased array semiconductor laser of claim 7 wherein said active region is planar.

9. The phased array semiconductor laser of claim 7 wherein said active region is nonplanar.

10. The phased array semiconductor laser of claim 1 wherein said active region comprises a thin active layer having thickness in the range of 50 nm to 300 nm.

11. The phased array semiconductor laser of claim 10 wherein said active region is planar.

12. The phased array semiconductor laser of claim 10 wherein said active region is nonplanar.

* * * * *